(12) United States Patent
Kwak et al.

(10) Patent No.: US 11,252,851 B2
(45) Date of Patent: Feb. 15, 2022

(54) ELECTRONIC DEVICE COMPRISING CONNECTOR

(71) Applicant: Samsung Electronics Co., Ltd., Gyeonggi-do (KR)

(72) Inventors: Heiseong Kwak, Gyeonggi-do (KR); Woohee Park, Gyeonggi-do (KR); Min Cho, Gyeonggi-do (KR); Byoungil Son, Gyeonggi-do (KR); Youngjin Kang, Gyeonggi-do (KR); Myeonggeun Kim, Gyeonggi-do (KR); Ungryeol Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/042,379

(22) PCT Filed: May 14, 2019

(86) PCT No.: PCT/KR2019/005536
§ 371 (c)(1),
(2) Date: Sep. 28, 2020

(87) PCT Pub. No.: WO2019/221442
PCT Pub. Date: Nov. 21, 2019

(65) Prior Publication Data
US 2021/0037684 A1 Feb. 4, 2021

(30) Foreign Application Priority Data

May 17, 2018 (KR) ........................ 10-2018-0056560

(51) Int. Cl.
*H05K 1/00* (2006.01)
*H05K 9/00* (2006.01)
(Continued)

(52) U.S. Cl.
CPC ........... *H05K 9/006* (2013.01); *G06F 1/1626* (2013.01); *H05K 1/0215* (2013.01);
(Continued)

(58) Field of Classification Search
CPC .. H05K 1/0268; H05K 3/0044; H05K 1/0277; H05K 2203/0228; H05K 2203/16
See application file for complete search history.

(56) References Cited

U.S. PATENT DOCUMENTS 5,165,055 A 11/1992 Metsler
6,377,475 B1 * 4/2002 Reis ..................... H05K 9/0035
361/818

(Continued)

FOREIGN PATENT DOCUMENTS

EP       3051625 A1    8/2016
KR  10-2004-0103225 A  12/2004
(Continued)

OTHER PUBLICATIONS

European Search Report dated Mar. 19, 2021.

*Primary Examiner* — Pete T Lee
(74) *Attorney, Agent, or Firm* — Cha & Reiter, LLC

(57) ABSTRACT

According to various embodiments of the present invention, an electronic device comprises: a connector comprising a conductive shell and at least one terminal arranged inside the conductive shell; a capacitor; and a circuit board comprising a first board layer at least partially facing the connector, a second board layer formed beneath the first board layer, and at least one third board layer formed between the first board layer and the second board layer. The circuit substrate comprises: a ground area made of a conductor formed at least one of the first board layer, the second board layer, or the at least one third board layer and electrically connected to the conductive shell through the capacitor while being connected to a ground portion of the electronic device; a first (Continued)

conductive area which is a partial area of the first board layer facing the connector, the first conductive area being made of a conductor having a first size and electrically connected to the conductive shell; and a second conductive area which is an area of the second board layer at least partially facing the first conductive area with the at least one third substrate layer interposed therebetween, the second conductive area being made of a conductor having a second size wider than the first size and electrically connected to the first conductive area. At least one of the first conductive area and the second conductive area may be arranged adjacent to the ground area such that the first conductive area and the second conductive area are electrically separated from the ground area.

20 Claims, 5 Drawing Sheets

(51) Int. Cl.
*G06F 1/16* (2006.01)
*H05K 1/02* (2006.01)
*H05K 5/00* (2006.01)
*H04M 1/02* (2006.01)

(52) U.S. Cl.
CPC ......... *H05K 1/0231* (2013.01); *H05K 5/0069* (2013.01); *H05K 9/0064* (2013.01); *H04M 1/026* (2013.01); *H05K 9/0049* (2013.01)

(56) References Cited

U.S. PATENT DOCUMENTS

| | | | |
|---|---|---|---|
| 7,389,129 B2* | 6/2008 | Shoji | H01Q 1/241 343/702 |
| 2006/0270472 A1* | 11/2006 | Chen | H04M 1/0214 455/575.7 |
| 2008/0119246 A1 | 5/2008 | Kang et al. | |
| 2009/0275235 A1 | 11/2009 | Shi et al. | |
| 2013/0141305 A1 | 6/2013 | Leem | |
| 2016/0254832 A1 | 9/2016 | Yoo et al. | |
| 2018/0090821 A1 | 3/2018 | Lee et al. | |

FOREIGN PATENT DOCUMENTS

| | | |
|---|---|---|
| KR | 10-2905-0060705 A | 6/2005 |
| KR | 10-2008-0067917 A | 7/2008 |
| KR | 10-2013-0062752 A | 6/2013 |
| KR | 10-2016-0104482 A | 9/2016 |
| KR | 10-2018-0035605 A | 4/2018 |

* cited by examiner

ELECTRONIC DEVICE COMPRISING CONNECTOR

CROSS REFERENCE TO RELATED APPLICATIONS

This application is a National Phase Entry of PCT international Application No. PCT/KR2019/005536, which was filed on May 14, 2019, and claims priority to Korean Patent Application No. 10-2018-0056560 filed on May 17, 2018, in the Korean Intellectual Property Office, the contents of which are incorporated herein by reference.

TECHNICAL FIELD

Various embodiments of the disclosure relate to an electronic device. Various embodiments of the disclosure relate to, for example, an electronic device having a stable electromagnetic-shielding structure between various electronic/electric components.

BACKGROUND ART

As electronic, information, and communication technologies have developed, various functions have come to be integrated into a single electronic device. For example, a smartphone includes functions of an audio reproduction device, an imaging device, a digital diary, or the like, in addition to a communication function, and a greater variety of functions may be implemented in the smartphone through installation of additional applications. An electronic device may be provided with various pieces of information in real time by accessing a server or another electronic device in a wired or wireless manner as well as by executing an installed application or a stored file. For example, an application or a stored information file may be directly transmitted/received between electronic devices or between an electronic device and a server without passing through a storage medium.

In order to provide services such as real-time online games or multimedia streaming, a large-capacity and ultra-high-speed communication environment may be required, and an electronic device may have a performance suitable for such a communication environment. For example, interface connectors of electronic devices initially provided a charging function, but have evolved into a universal serial bus scheme and are capable of providing a function of transmitting/receiving data through wired access. Recently, a mobile communication terminal may be utilized similarly to a personal computer through wired access via a connector. As another example, initial mobile communication terminals provided functions such as voice call and short message transmission through commercial communication networks. However, based on communication protocols such as wireless LAN and Bluetooth, mobile communication terminals have come to be able to transmit/receive various types of information by accessing other electronic devices or networks therearound.

DETAILED DESCRIPTION OF THE INVENTION

Technical Problem

As wired or wireless communication based on various schemes or protocols for allowing one electronic device to access another electronic device or a network has been commercialized, it may be difficult for a miniaturized electronic device to ensure a stable communication environment between different communication methods. For example, when communication is performed simultaneously through two different communication schemes, communication performance may be degraded due to mutual interference, and such degradation in communication performance may be more pronounced in a miniaturized electronic device.

According to an embodiment, when a housing including a metal portion is applied to an electronic device, a housing (e.g., a metal portion) may be connected to a ground portion or a portion of the metal portion may be used as an antenna in order to provide a stable communication environment. However, when wired charging is performed through a connector, and when the connector is connected to a metal portion of the housing and a common ground portion, there may be a risk of electric shock to a user due to leakage of DC current. Leakage current may be blocked by providing an independent ground to the metal portion of the housing and the connector. However, electromagnetic interference may occur when the metal portion of the housing and the connector are disposed adjacent to each other and an independent ground is provided. When the metal portion of the housing is used as an antenna, such electromagnetic interference may become an obstacle to ensuring a stable communication environment.

Various embodiments of the disclosure may provide an electronic device capable of effectively blocking leakage current even when a housing including a metal portion is applied.

Various embodiments of the disclosure are able to provide an electronic device in which stable electromagnetic shielding is implemented between electric/electronic components (e.g., a connector and a metal portion of a housing) while providing an independent ground to a connector and a metal portion of a housing.

Technical Solution

According to various embodiments, an electronic device may include: a connector including a conductive shell and at least one terminal disposed inside the conductive shell; a capacitor; and a circuit board including a first substrate layer at least partially facing the connector, a second substrate layer disposed under the first substrate layer, and at least one third substrate layer disposed between the first substrate layer and the second substrate layer. The circuit board may include: a ground area disposed on at least one of the first substrate layer, the second substrate layer, or the at least one third substrate layer, the ground area being formed of a conductor connected to a ground portion of the electronic device and electrically connected to the conductive shell via the capacitor; a first conductive area, which is a partial area of the first substrate layer facing the connector, the first conductive area being formed of a conductor having a first size to be electrically connected to the conductive shell; and a second conductive area, which is an area of the second substrate layer that at least partially faces the first conductive area, with the at least one third substrate layer interposed therebetween, the second conductive area being formed of a conductor having a second size larger than the first size to be electrically connected to the first conductive area. The first conductive area and the second conductive area may be electrically separated from the ground area, and at least one of the first conductive area and the second conductive area is disposed adjacent to the ground area.

According to various embodiments, an electronic device may include: a connector including a conductive shell and at least one terminal disposed inside the conductive shell; a capacitor; and a circuit board including a first substrate layer at least partially facing the connector and a second substrate layer disposed under the first substrate layer. The circuit board may include: a ground area disposed on the first substrate layer or the second substrate layer, the ground area being formed of a conductor connected to a ground portion of the electronic device and electrically connected to the conductive shell via the capacitor; a first conductive area, which is a partial area of the first substrate layer facing the connector, the first conductive area being formed of a conductor to be electrically connected to the conductive shell; and a second conductive area, which is an area of the second substrate layer that faces the first conductive area, the second conductive area being formed of a conductor to be electrically connected to the first conductive area. At least one of the first conductive area and the second conductive area may be disposed adjacent to the ground area.

According to various embodiments, an electronic device may include: a connector including a conductive shell and at least one terminal disposed inside the conductive shell; a circuit board including a first substrate layer at least partially facing the connector and a second substrate layer disposed under the first substrate layer; a housing at least partially including a metal portion, the housing being configured to accommodate at least the connector and the circuit board; and a processor or a communication module configured to perform wireless communication using the metal portion of the housing. The circuit board may include: a ground area disposed on at least one of the first substrate layer or the second substrate layer, the ground area being formed of a conductor connected to a ground portion of the electronic device and forming capacitive coupling with the conductive shell; a first conductive area, which is a partial area of the first substrate layer facing the connector, the first conductive area being formed of a conductor having a first size to be electrically connected to the conductive shell; and a second conductive area, which is an area of the second substrate layer that at least partially faces the first conductive area, the second conductive area being formed of a conductor having a second size larger than the first size to be electrically connected to the first conductive area or to form capacitive coupling with the first conductive area. The first conductive area and the second conductive area may be electrically separated from the ground area, and at least one of the first conductive area and the second conductive area may be disposed adjacent to the ground area.

Advantageous Effects

In an electronic device according to various embodiments of the disclosure, a conductive shell of a connector mounted on a circuit board can be electrically separated from a ground portion of the electronic device or a ground area of the circuit board connected to the ground portion while being electrically connected to a conductive area. For example, even if charging or the like is performed through the connector, it is possible to prevent leakage current (e.g., DC current) from being guided to the ground portion or the ground area. According to an embodiment, the conductive shell of the connector is connected to the ground region of the circuit board via a capacitor to form capacitive coupling. Therefore, it is possible to guide a noise signal or the like based on AC current to the ground portion or the ground area. For example, it is possible to prevent an electromagnetic noise signal generated when a data signal or charging power is transmitted via the connector from interfering with other electric/electronic components in the vicinity of the connector. According to an embodiment, even if a metal part of the housing disposed adjacent to the connector is utilized as an antenna, a noise signal or the like is blocked. Thus, it is possible to ensure a stable communication environment and to prevent a user's electric shock due to leakage current.

MODE FOR CARRYING OUT THE INVENTION

Figure 1:
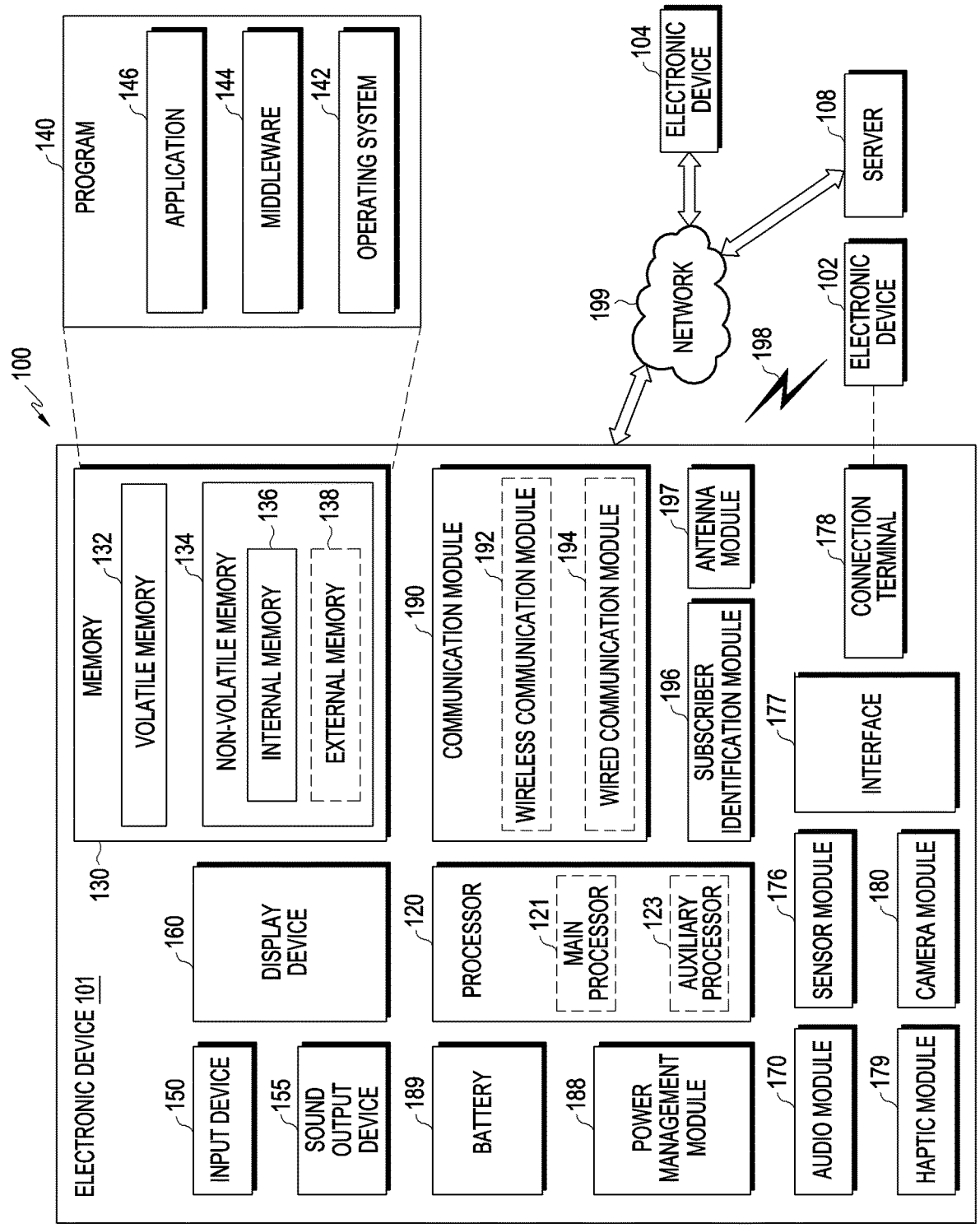
FIG. 1 is a block diagram illustrating an electronic device according to various embodiments of the disclosure within a network environment.

As the disclosure allows for various changes and numerous embodiments, various example embodiments will be described in greater detail with reference to the accompanying drawings. However, it should be understood that the disclosure is not limited to the specific embodiments, and that the disclosure includes all modifications, equivalents, and alternatives within the spirit and the scope of the disclosure.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Although ordinal terms such as "first" and "second" may be used to describe various elements, these elements are not limited by the terms. The terms are used merely to distinguish an element from the other elements. For example, a first element could be termed a second element, and similarly, a second element could be also termed a first element without departing from the scope of the disclosure. As used herein, the term "and/or" includes any and all combinations of one or more associated items. It is to be understood that if an element (e.g., a first element) is referred to, with or without the term "operatively" or "communicatively", as "coupled with," or "connected with,", the element may be coupled with the other element directly (e.g., wiredly), wirelessly, or via a third element.

Further, the relative terms "a front surface", "a rear surface", "a top surface", "a bottom surface", and the like which are described with respect to the orientation in the drawings may be replaced by ordinal numbers such as first and second. In the ordinal numbers such as first and second, their order are determined in the mentioned order or arbitrarily.

In the disclosure, the terms are used to describe specific embodiments, and are not intended to limit the disclosure. As used herein, the singular forms are intended to include the plural forms as well, unless the context clearly indicates otherwise. In the disclosure, the terms such as "include" and/or "have" may be understood to denote a certain characteristic, number, step, operation, constituent element, component or a combination thereof, but may not be construed to exclude the existence of or a possibility of addition of one or more other characteristics, numbers, steps, operations, elements, components or combinations thereof.

Unless defined differently, all terms used herein, which include technical terminologies or scientific terminologies, have the same meaning as that understood by a person skilled in the art to which the disclosure belongs. Such terms as those defined in a generally used dictionary are to be interpreted to have the meanings equal to the contextual meanings in the relevant field of art, and are not to be interpreted to have ideal or excessively formal meanings unless clearly defined in the disclosure.

In the disclosure, an electronic device may be a random device, and the electronic device may be called a terminal, a portable terminal, a mobile terminal, a communication terminal, a portable communication terminal, a portable mobile terminal, a touch screen or the like.

For example, the electronic device may, for example, and without limitation, be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device may be implemented as a portable communication terminal which has a wireless communication function and a pocket size. Further, the electronic device may be a flexible device or a flexible display device. However, the disclosure is not limited thereto.

The electronic device may communicate with an external electronic device, such as a server or the like, or perform an operation through an interworking with the external electronic device. For example, the electronic device may transmit an image photographed by a camera and/or position information detected by a sensor unit to the server through a network. The network may be a mobile or cellular communication network, a Local Area Network (LAN), a Wireless Local Area Network (WLAN), a Wide Area Network (WAN), an Internet, a Small Area Network (SAN) or the like, but is not limited thereto.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by a component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or an external electronic device (e.g., an electronic device 102 (e.g., a speaker or a headphone)) directly or wirelessly coupled with the electronic device 101.

The sensor module 176 may detect an internal operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module, etc.) or a wired communication module 194 (e.g., a local area network (LAN) communication module or a power line communication (PLC) module, etc.). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and at least one antenna appropriate for a communication scheme used in the communication network, such as the first network 198 or the second network 199, may be selected, for example, by the communication module 190 from the one or more antennas. The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service.

The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented as an application-specific integrated circuit (ASIC).

Figure 2:
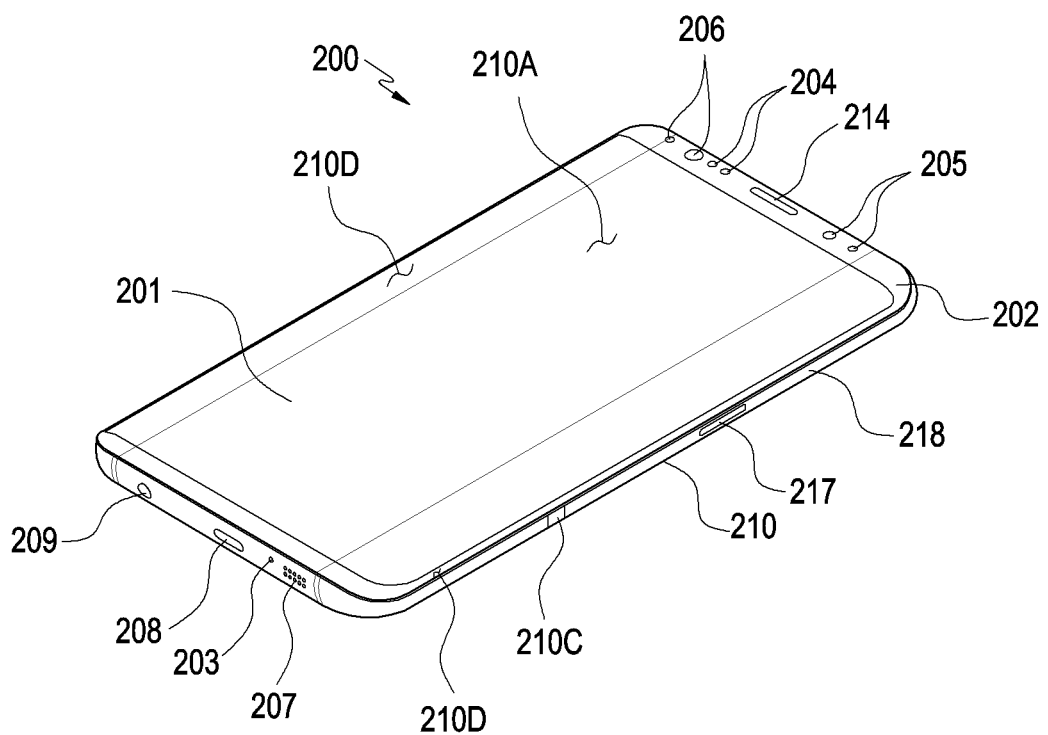
FIG. 2 is a perspective view illustrating the rear side of an electronic device according to various embodiments.
Figure 3:
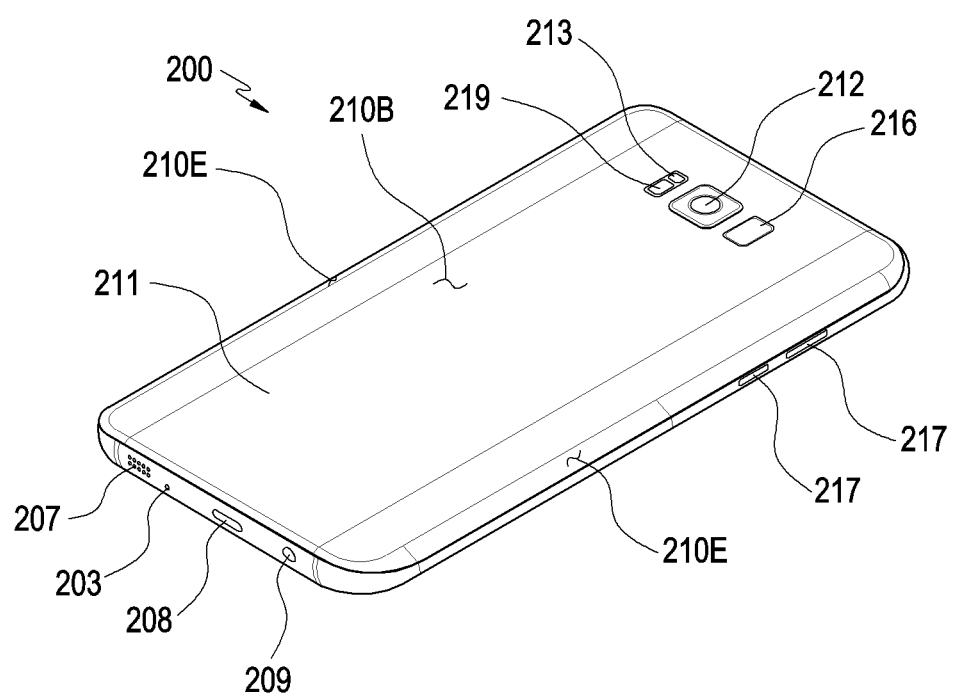
FIG. 3 is a perspective view illustrating the rear side of the electronic device illustrated in FIG. 2.

FIG. 2 is a perspective view illustrating the front side of an electronic device 200 according to various embodiments. FIG. 3 is a perspective view illustrating the rear side of the electronic device 200 illustrated in FIG. 2.

Referring to FIGS. 2 and 3, according to an embodiment, the electronic device 200 may include a housing 210 including a first surface (or a front surface) 210A, a second surface (or a rear surface) 210B, and a side surface 210C surrounding the space between the first surface 210A and the second surface 210B. In another embodiment (not illustrated), the term "housing" may refer to a structure forming some of the first surface 210A, the second surface 210B, and the side surface 210C of FIG. 1. According to an embodiment, at least a portion of the first surface 210A may be formed by a substantially transparent front plate 202 (e.g., a glass plate or a polymer plate including various coating layers). In another embodiment, the front plate 202 may be coupled to the housing 210 so as to form an inner space with the housing 210. Here, the term "inner space" may mean the space between the front plate 202 and a first support member (e.g., the first support member 411 in FIG. 4) to be described later. In various embodiments, the term "inner space" may mean the inner space of the housing 210 that accommodates at least a portion of a display 201 to be described later or the display 430 in FIG. 4.

According to various embodiments, the second surface 210B may be formed by a substantially opaque rear plate 211. The rear plate 211 may be formed of, for example, coated or colored glass, ceramic, a polymer, a metal (e.g., aluminum, stainless steel (STS), or magnesium), or a combination of two or more of these materials. The side surface 210C may be formed by a side bezel structure 218 (or a "side member") coupled to the front plate 202 and the rear plate 211 and including a metal and/or a polymer. In various embodiments, the rear plate 211 and the side bezel structure 218 may be integrally formed, and may include the same material (e.g., a metal material such as aluminum).

In the illustrated embodiment, the front plate 202 may include, at the long opposite side edges thereof, two first areas 210D (e.g., the curved portions R in FIG. 4), which are bent from the first surface 210A toward the rear plate 211 and extend seamlessly. In the illustrated embodiment (see FIG. 3), the rear plate 211 may include, at the long opposite side edges thereof, two second areas 210E, which are bent from the second face 210B towards the front plate 202 and extend seamlessly. In various embodiments, the front plate 202 (or the rear plate 211) may include only one of the first areas 210D (or the second areas 210E). In another embodiment, some of the first areas 210D or the second areas 210E may not be included. In the above embodiments, when viewed from a side of the electronic device 200, the side bezel structure 218 may have a first thickness (or width) on the side surface in which the first areas 210D or the second areas 210E are not included (e.g., the side surface in which the connector hole 208 is disposed), and may have a second thickness, which is smaller than the first thickness, on the side surface in which the first areas 210D or the second areas 210E are included (e.g., the side surfaces in which the key input devices 217 are disposed).

According to an embodiment, the electronic device 200 may include at least one of a display 201, audio modules 203, 207, and 214, sensor modules 204, 216, and 219, camera modules 205, 212, and 213, key input devices 217, light-emitting elements 206, and connector holes 208 and 209. In various embodiments, at least one of the components (e.g., the key input devices 217 or the light-emitting elements 206) may be omitted from the electronic device 200, or the electronic device 100 may additionally include other components.

The display 201 may be exposed through, for example, a considerable portion of the front plate 202. In various embodiments, at least a portion of the display 201 may be exposed through the front plate 202 forming the first surface 210A and the first areas 210D of the side surfaces 210C. In various embodiments, the edges of the display 201 may be formed to be substantially the same as the shape of the periphery of the front plate 202 adjacent thereto. In another embodiment (not illustrated), the distance between the periphery of the display 201 and the periphery of the front plate 202 may be substantially constant in order to enlarge the exposed area of the display 201.

In another embodiment (not illustrated), recesses or openings may be formed in a portion of a screen display area (e.g., an active area) or an area (e.g., a non-active area) out of the screen display area of the display 201, and at least one of the audio module 214, the sensor modules 204, the camera modules 205, and the light-emitting elements 206, which are aligned with the recesses or the openings, may be included. In another embodiment (not illustrated), the rear surface of the screen display area of the display 201 may include at least one of the audio modules 214, the sensor modules 204, the camera modules 205, the fingerprint sensor 216, and the light-emitting elements 206. In another embodiment (not illustrated), the display 201 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 204 and 219 and/or at least some of the key input devices 217 may be disposed in the first areas 210D and/or the second areas 210E.

The audio modules 203, 207, and 214 may include a microphone hole 203 and speaker holes 207 and 214. The microphone hole 203 may include a microphone disposed therein so as to acquire external sound, and in various embodiments, multiple microphones may be disposed therein so as to detect the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker (e.g., a piezo speaker) may be included without the speaker holes 207 and 214.

The sensor modules 204, 216, and 219 may generate electrical signals or data values corresponding to the internal operating state or the external environmental state of the electronic device 200. The sensor modules 204, 216, and 219 may include, for example, a first sensor module 204 (e.g., a proximity sensor), a second sensor module (not illustrated) (e.g., a fingerprint sensor) disposed on the first surface 210A of the housing 210, a third sensor module 219 (e.g., an HRM sensor), and/or a fourth sensor module 216 (e.g., a fingerprint sensor) disposed on the second surface 210B of the housing 210. The fingerprint sensor may be disposed not only on the first surface 210A (e.g., the display 201) of the housing 210, but also on the second surface 210B. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212, and 213 may include a first camera device 205 disposed on the first surface 210A of the electronic device 200, and a second camera device 212 and/or a flash 213 disposed on the second surface 210B. The camera modules 205 and 212 may include one or more lenses, an image sensor, and/or an image signal processor. The flash 213 may include, for example, a light-emitting diode or a xenon lamp. In various embodiments, two or more lenses (e.g., an infrared camera lens, a wide-angle lens, and a telephoto lens) and image sensors may be disposed on one surface of the electronic device 200.

The key input devices 217 may be disposed on the side surface 210C of the housing 210. In another embodiment, the electronic device 200 may not include some or all of the above-mentioned key input devices 217, and a key input device 217, which is not included therein, may be implemented in another form of a soft key or the like on the display 201. In some embodiments, the key input devices may include a sensor module 216 disposed on the second surface 210B of the housing 210.

The light-emitting elements 206 may be disposed, for example, on the first surface 210A of the housing 210. The light-emitting elements 206 may provide, for example, information about the state of the electronic device 200 in an optical form. In another embodiment, the light-emitting elements 206 may provide a light source that is interlocked with, for example, the operation of the camera modules 205. The light-emitting elements 206 may include, for example, an LED, an IR LED, and a xenon lamp.

The connector holes 208 and 209 may include a first connector hole 208 that is capable of accommodating a connector (e.g., a USB connector) for transmitting/receiving power and/or data to/from an external electronic device, and/or a second connector hole 209 that is capable of accommodating a connector (e.g., an earphone jack) for transmitting/receiving an audio signal to/from an external electronic device.

Figure 4:
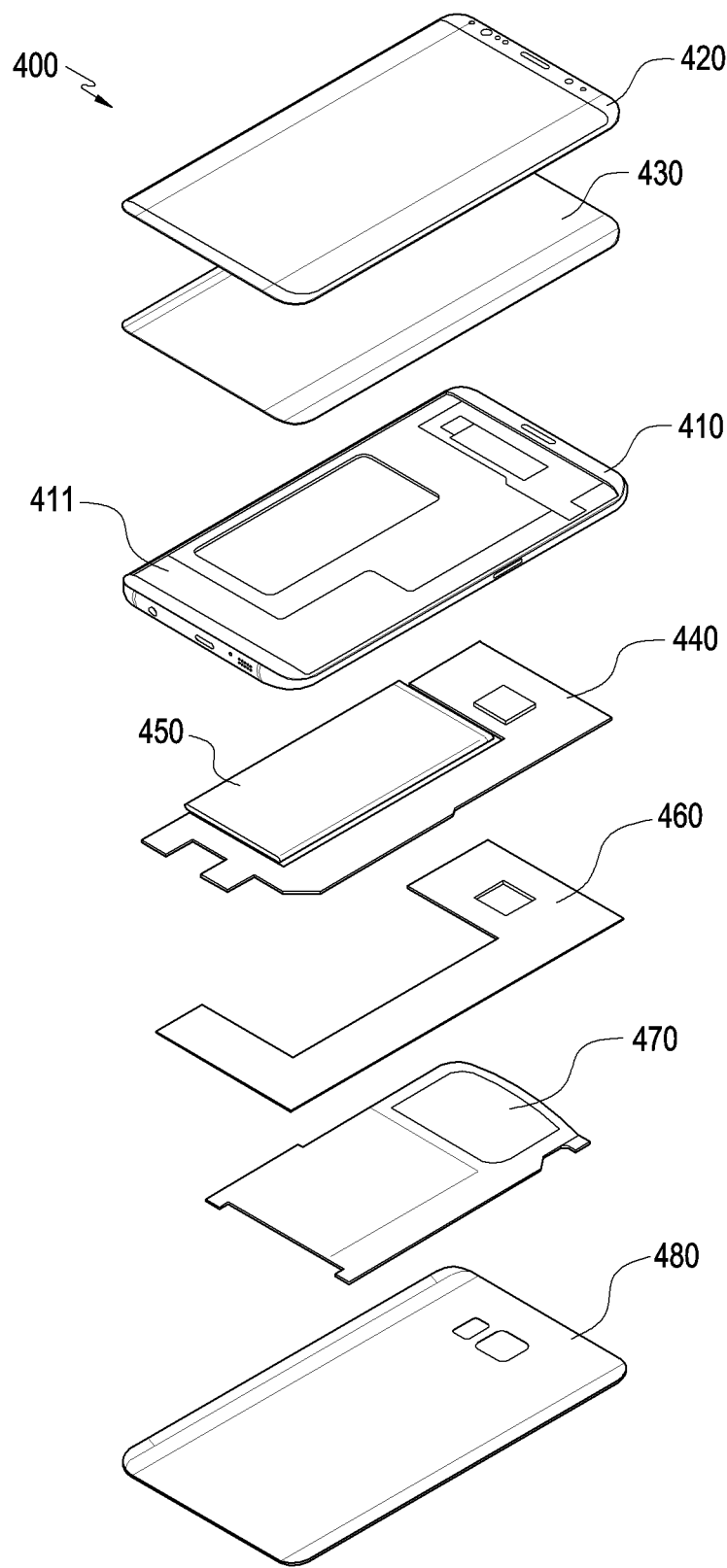
FIG. 4 is an exploded perspective view illustrating the electronic device illustrated in FIG. 2.

FIG. 4 is an exploded perspective view illustrating the electronic device illustrated in FIG. 2.

Referring to FIG. 4, an electronic device 400 may include a side bezel structure 410, a first support member 411 (e.g., a bracket), a front plate 420, a display 430, a printed circuit board 440, a battery 450, a second support member 460 (e.g., a rear case), an antenna 470, and a rear plate 480. In various embodiments, in the electronic device 400, at least one of the components (e.g., the first support member 411 or the second support member 460) may be omitted, or other components may be additionally included. At least one of the components of the electronic device 400 may be the same as or similar to at least one of the components of the electronic device 200 of FIG. 2 or 3, and a redundant description thereof is omitted below.

The first support member 411 may be disposed inside the electronic device 400, and may be connected to the side bezel structure 410 or may be integrated with the side bezel structure 410. The first support member 411 may be formed of, for example, a metal material and/or a non-metal material (e.g., a polymer). The display 430 may be coupled to one surface of the first support member 411, and the printed circuit board 440 may be coupled to the other surface of the first support member 411. On the printed circuit board 440, a processor, a memory, and/or an interface may be mounted. The processor may include at least one of, for example, a central processing unit, an application processor, a graphics processor, an image signal processor, a sensor hub processor, or a communication processor.

Substantially the entire area of the display 430 may be attached to the inner surface of the front plate 420, and an opaque layer may be disposed in the periphery of or around the area in which the display 430 is attached on the inner surface of the front plate 420. In the area of the front plate 420 in which the display 430 is not disposed, such an opaque layer may block the exposure of a portion of an inner structure (e.g., the first support member 411) of the electronic device 400 to the outside.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 400, to an external electronic device, and may include a USB connector, an SD card/an MMC connector, or an audio connector.

The battery 450 is a device for supplying power to at least one component of the electronic device 400, and may include, for example, a non-rechargeable primary battery, a rechargeable secondary battery, or a fuel cell. At least a portion of the battery 450 may be disposed on substantially the same plane as, for example, the printed circuit board 440. The battery 450 may be integrally disposed inside the electronic device 400, or may be detachably disposed on the electronic device 400.

The antenna 470 may be disposed between the rear plate 480 and the battery 450. The antenna 470 may include, for example, a nearfield communication (NFC) antenna, a wireless charging antenna, and/or a magnetic secure transmission (MST) antenna. The antenna 470 is capable of, for example, performing short-range communication with an external device or transmitting/receiving power required for charging to/from an external device in a wireless manner. In another embodiment, an antenna structure may be formed by the side bezel structure 410 and/or a portion of the first support member 411, or a combination thereof.

Figure 5:
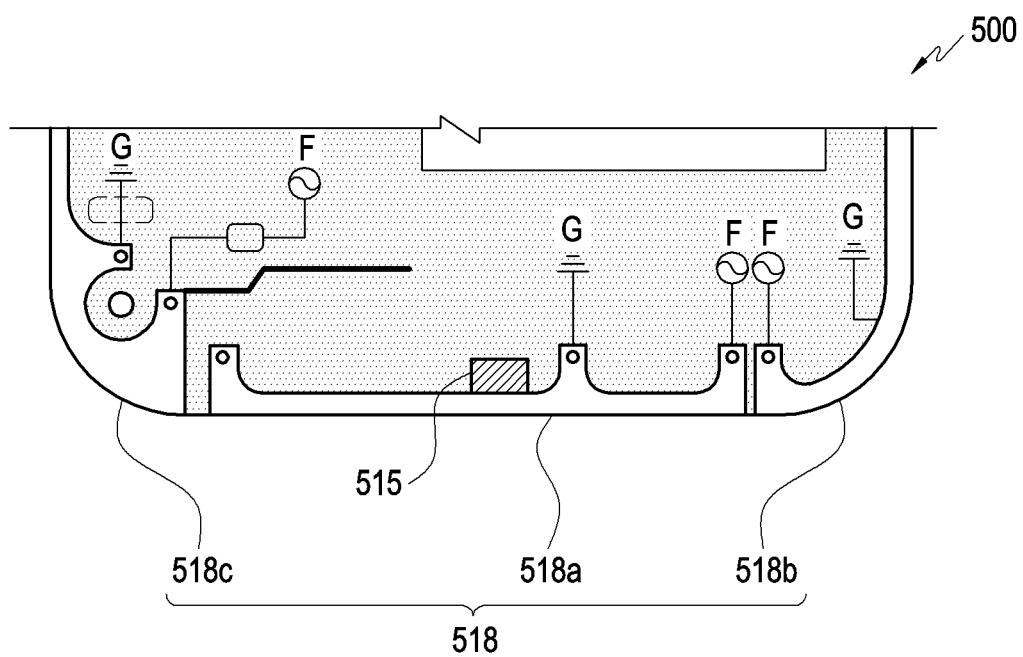
FIG. 5 is a view illustrating a configuration of a portion of an electronic device according to various embodiments of the disclosure.

FIG. 5 is a view illustrating the configuration of a portion of an electronic device 500 (e.g., the electronic device 101 or 400 of FIG. 1 or FIG. 4) according to various embodiments of the disclosure.

Referring to FIG. 5, the electronic device 500 may include an antenna implemented using a side member 518 (e.g., the side bezel structure 410 in FIG. 4), which forms a portion of a housing. For example, the side member 518 may include multiple metal portions 518a, 518b, and 518c, and each of the metal portions 518a, 518b, and 518c may be connected to a power-feeding portion F or a ground portion G so as to be used as a radiating conductor. According to an embodiment, the metal portions 518a, 518b, and 518c are fed with common power or independent power from a processor or a communication module (e.g., the processor 120 or the communication module 190 in FIG. 1) so as to transmit/receive a wireless signal. For example, the electronic device 500 or the processor or communication module of the electronic device 500 may perform wireless communication using at least some of the metal portions 518*a*, 518*b*, and 518*c*.

According to various embodiments, the metal portions 518*a*, 518*b*, and 518*c* may be sequentially arranged along an edge of the electronic device 500 in the state of being insulated from each other, and at least one of the metal portions 518*a*, 518*b*, and 518*c* (e.g., the metal portion denoted by reference numeral "518*a*") may include a connector hole (e.g., the connector hole 208 in FIG. 2 or FIG. 3). For example, a connector 515 (e.g., the connection terminal 178 in FIG. 1) may be disposed adjacent to at least one of the metal portions 518*a*, 518*b*, and 518*c*.

Hereinafter, further referring to FIG. 6, a structure for blocking leakage current between the metal portions 518*a*, 518*b*, and 518*c* and the connector 515 and an electromagnetic shielding structure between the metal portions 518*a*, 518*b*, and 518*c* and the connector 515 will be described. In the following detailed description, the wording "electrically connected" may be used to refer to a structure that allows both the flow of DC current and the flow of AC current, and the wording "electrically separated" may be used to refer to a structure that allows the flow of AC current depending on the frequency band thereof while substantially blocking the flow of DC current. In some embodiments, there may be a description of being "electrically connected through a capacitor", which may be used to refer to a structure that allows the flow of AC current while substantially blocking the flow of DC current.

Figure 6:
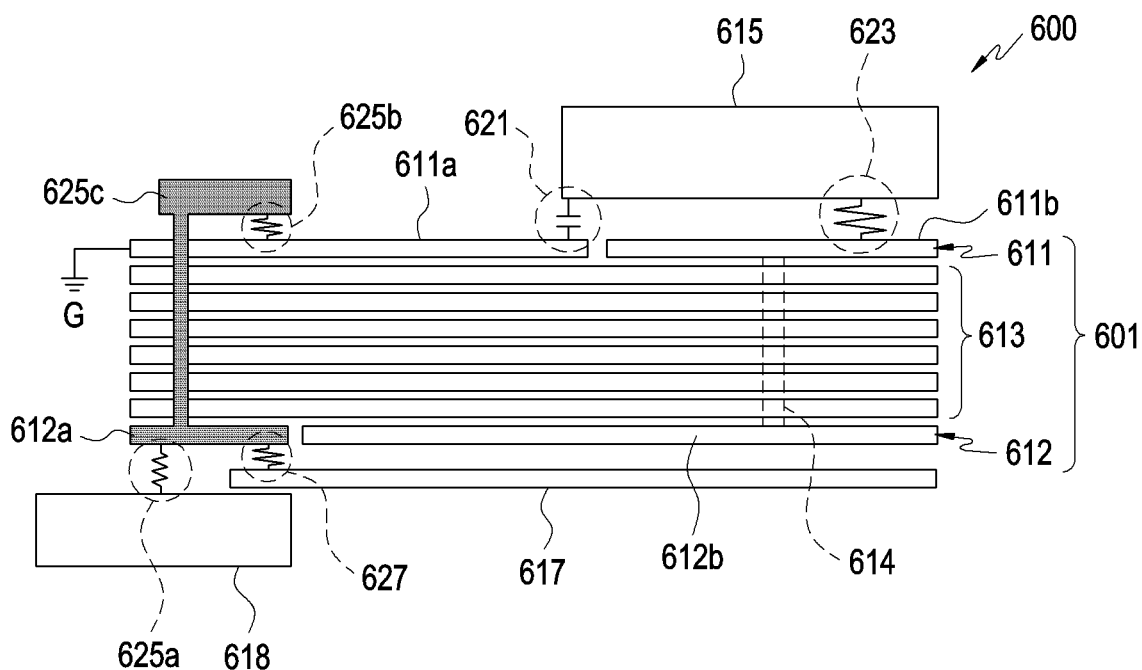
FIG. 6 is a view illustrating a configuration of a portion of the electronic device according to various embodiments of the disclosure.

FIG. 6 is a view illustrating the configuration of a portion of an electronic device 600 (e.g., the electronic device 500 in FIG. 5) according to various embodiments of the disclosure.

Referring to FIG. 6, a connector (e.g., the connector 515 in FIG. 5) or a conductive shell 615 of the connector may be provided with an independent ground for another structure, such as a metal portion 618 of the housing (e.g., the metal portions 518*a*, 518*b*, and 518*c*) material of FIG. 5). Hereinafter, for the sake of brevity of description, a configuration for providing a ground to the conductive shell 615 will be generally referred to as a "conductive area". According to an embodiment, the conductive shell 615 or a conductive area 611*b* or 612*b* connected to the conductive shell 615 or the metal portion 618 of the housing or a ground area 611*a* or 612*a* connected to the metal portion 618 may be provided, and the conductive area 611*b* or 612*b* and the ground area 611*a* or 612*a* may be connected via capacitive coupling or a capacitive element such as a capacitor while being electrically separated.

According to various embodiments, the electronic device 600 may include a housing 600, for example, a connector (e.g., the connector 515 in FIG. 5) accommodated in the side member 518 in FIG. 5, a capacitor 621, and a circuit board 601. In an embodiment, the connector may include the conductive shell 615 accommodating at least one terminal. The conductive shell 615 allows insertion of an external connector (e.g., a plug), and may block electromagnetic interference with other electric/electronic components by inducing electromagnetic waves, which may be generated in the connector, or the like to a conductive area (e.g., the first conductive area 611*b*). For example, the conductive shell 615 may function as a shield member. In an embodiment, the capacitor 621 may connect the conductive shell 615 to a ground area (e.g., a first ground region 611*a*). For example, the conductive shell 615 may be electrically connected to the first ground area 611*a* through the capacitor 621. In some embodiments, if it is possible for the conductive shell 615 to form capacitive coupling with the first ground area while being electrically separated from the first ground area 611*a*, the capacitor 621 may not be disposed.

According to various embodiments, the circuit board 601 may at least partially include a connector, for example, a first substrate layer 611 facing the conductive shell 615 and a second substrate layer 612 disposed below the first substrate layer 612. In some embodiments, at least one third substrate layer 613 may be formed between the first substrate layer 611 and the second substrate layer 612, and each of the substrate layers 611, 612, and 613 may include a printed circuit pattern that provides circuit wiring. The number of third substrate layers 613 may vary depending on an embodiment, and for example, six third substrate layers 613 may be provided. The third substrate layers 613 described above may include a conductor or a printed circuit pattern for grounding, data signal transmission, charging power transmission, or the like. In an embodiment, conductors or printed circuit patterns forming the substrate layers 611, 612, and 613 may partially form an area in which a ground is provided. Although not illustrated in the drawings, insulating layers may be disposed in respective spaces between the substrate layers 611, 612, and 613, and via holes or the like for connecting the printed circuit patterns of different substrate layers may be further disposed in the insulating layers.

According to various embodiments, the first substrate layer 611 may include a ground area such as a first ground region 611*a* and a conductive area such as a first conductive region 611*b*. For example, the first ground area 611*a* and the first conductive area 611*b* may be formed of substantially the same conductor, and may be disposed adjacent to each other, but may be electrically separated. The first ground area 611*a* may be substantially electrically connected to a ground portion G of the electronic device 600 (e.g., the ground portion G of FIG. 5), and the first conductive area 611*b* or the conductive shell 615 may be connected through capacitive coupling while being electrically separated from the first ground area 611*a* or the ground portion G. For example, the flow of DC current is blocked between the first conductive area 611*b* and the first ground area 611*a*, but the capacitive coupling or electromagnetic coupling of the second conductive area 612*b*, the shield layer 617, or the like to be described later may allow induction and transmission of AC current, for example, a noise signal, between the first conductive area 611*b* and the first ground area 611*a*.

According to various embodiments, the conductive shell 615 may be disposed to substantially face the first substrate layer 611. For example, a portion of the conductive shell 615 may be disposed to face the first ground area 611*a* and another portion of the conductive shell 615 may be disposed to face the first conductive area 611*b*. As described above, the conductive shell 615 may form capacitive coupling with the first ground area 611*a*, or may be electrically connected to the first ground area 611*a* through the capacitor 621. In an embodiment, the conductive shell 615 may be electrically connected 623 to the first conductive area 611*b*. For example, the conductive shell 615 may be electrically connected to the first conductive area 611*b* (623) while being mounted on the circuit board 601 or on the first substrate layer 611 via a conductive wire, a conductive tape, soldering, or the like.

According to various embodiments, AC current (e.g., a noise signal) leaked from a connector (e.g., the connector 515 in FIG. 5) may be guided to the first ground area 611*a* or the first conductive area 611*b*, and may be substantially guided to the ground portion G so that electromagnetic interference with other electric/electronic components can be suppressed or blocked. In some embodiments, DC current leaked from the connector 515 may not be guided to the ground portion G, but may be guided to the first conductive area 611*b*. Since the first conductive area 611*b* is electrically separated from another conductor, for example, the first ground area 611*a*, it is possible to block the leaked DC current guided to other electric/electronic components (e.g., the metal portions 518*a*, 518*b*, and 518*c* in FIG. 5).

According to various embodiments, the second substrate layer 612 may include a second ground area 612*a* and a second conductive area 612*b*, and the second conductive area 612*b* may be disposed at least partially face the first conductive area 611*b*. When the at least one third substrate layer 613 is disposed, the second substrate layer 612 (e.g., the second conductive area 612*b*) may be disposed to face the first conductive area 611*b*, with substantially at least a portion of the at least one third substrate layer 613 interposed therebetween. According to an embodiment, the second conductive area 612*b* may be electrically connected to the first conductive area, or may form capacitive coupling with the first conductive area 611*b* even if the second conductive area 612*b* is separated from the first conductive area 611*b*. For example, a via hole 614 or the like may be disposed in the insulating layer between the first substrate layer 611 and the second substrate layer 612 or in the at least one third substrate layer 613, thereby providing an environment in which the first conductive area 611*b* and the second conductive area 612*b* can be electrically connected or at least capacitive coupling can be formed. According to an embodiment, the second conductive area 612*b* may substantially provide a ground to the conductive shell 615 together with the first conductive area 611*b*, and the leaked current (DC current or a noise signal) transmitted through the conductive shell 615 may be guided to the first conductive area 611*b* or the second conductive area 612*b*.

According to various embodiments, the second ground area 612*a* may be electrically connected to the first ground area 611*a* (625*a* and 625*b*) while being electrically separated from the second conductive area 612*b*. For example, the second ground area 612*a* may be substantially electrically connected to the ground portion G. Although not illustrated in the drawings, the circuit board 601 may further include a third ground area. For example, the third ground area may be disposed in the at least one third substrate layer 613 or some of selected third substrate layers 613 when multiple third substrates 613 are provided, and the third ground area be electrically connected to the first ground area 611*a* or the second ground area 612*a*. The first ground area 611*a* and the second ground area 612*a* (or the third ground area) may be electrically connected to each other generally via a conductor or the like, and according to an embodiment, a capacitive element 625*c* may be further disposed in such a connection path. For example, between the first ground area 611*a* and the second ground area 612*a*, the flow of AC current (e.g., a noise signal) may be allowed while the flow of DC current is blocked.

According to various embodiments, the at least one third substrate layer 613 may generally include a printed circuit pattern for transmitting data signals, power, or the like, and the first substrate layer 611 and the second substrate layer 612 may provide an electromagnetic shielding structure to the at least one third substrate layer 613. For example, the above-described ground areas 611*a* and 612*a* or conductive areas 611*b* and 612*b* may absorb and block a noise signal induced from the external environment or through the conductive shell 615 or the like. Therefore, the substrate layer 615 is able to stably transmit a data signal or the like.

According to various embodiments, when the housing (e.g., the side bezel structure 410 in FIG. 4) of the electronic device 600 includes a metal portion 618 (e.g., the metal portions 518*a*, 518*b*, and 518*c* in FIG. 5), the metal portion 618 may be electrically connected to the ground portion G (e.g., the ground portion G in FIG. 5). For example, the circuit board 601 or the conductive shell 615 may be disposed adjacent to the metal portion 618, and the metal portion 618 may be electrically connected to a ground area (e.g., the first ground 611*a* or the second ground area 612*a*) (625*a* and 625*b*). In connecting the metal portion 618 with the ground area, various conductors, such as a conductive screw, a C-clip, and a conductive wire, may be used.

According to various embodiments, as described with reference to FIG. 5, the metal portion 618 may be fed with power from a processor or a communication module (e.g., the processor 120 or the communication module 190 in FIG. 1) so as to be utilized as an antenna. In an embodiment, the electronic device 600 may further include a shielding layer 617 so as to provide an electromagnetic shielding structure for the metal portion 618 functioning as an antenna. For example, the shielding layer 617 may provide an electromagnetic shielding structure between the circuit board 601 and the metal portion 618.

According to various embodiments, the shielding layer 617 may be disposed to at least partially face the second substrate layer 612 in the state of being electrically separated from the second conductive area 612*b* while generally facing the second conductive area 612*b*. According to an embodiment, the shielding layer 617 may be a conductive tape attached to the second substrate layer 612, and may form capacitive coupling with the second conductive area 612*b*. For example, the flow of DC current may be blocked between the second conductive area 612*b* and the shielding layer 617, and the flow of AC current such as a noise signal may be allowed. In another embodiment, the shielding layer 617 may be electrically connected to a ground such as the second ground area 612*a*, thereby guiding, to the ground portion G, a noise signal or the like induced from the second conductive area 612*b*. For example, the shielding layer 617 may provide an electromagnetic shielding structure between at least the conductive shell 615 or the circuit board 601 and the metal portion 618 by guiding a noise signal or the like to the ground part G.

According to various embodiments, the first conductive area 611*b* may be formed of a conductor having a size substantially corresponding to an area facing the conductive shell 615. In some embodiments, when viewed in a plan view, a portion of the conductive shell 615 may be disposed to face the first ground area 611*a*, and another portion of the conductive shell 615 may be disposed to face the first conductive area 611*b*. According to an embodiment, the second conductive area 612*b* may be formed of a conductor having a larger size than the first conductive area 611*b*. For example, an electromagnetic noise signal introduced from the outside or generated from the conductive shell 615 may be easily guided to the second conductive area 612*b* via the first conductive area 611*b*. In another embodiment, since the second conductive area 612*b* has a larger size than the first conductive area 611*b*, a cut-off frequency for a noise signal may be lowered. When wireless communication is performed through the metal portion 618, it is possible to prevent a noise signal related to a connector (e.g., the connector 515 in FIG. 5) or the conductive shell 615 from interfering with the wireless communication signal. In still another embodiment, the shielding layer 617 may be formed of a conductor having a size larger than that of the second conductive area 612*b*. For example, a noise signal or the like induced in the second conductive area 612*b* may be substantially guided to the ground portion G through the shielding layer 617. In this way, a stable electromagnetic shielding structure may be provided between the circuit board 601 or the connector and the metal portion 618, and stable wireless communication may be performed through the metal portion 618.

As described above, in an electronic device (e.g., the electronic device 500 or 600 in FIG. 5 or 6) according to various embodiments of the disclosure, since a connector (e.g., the connector 515 in FIG. 5) or the conductive shell (e.g., the conductive shell 615 in FIG. 6) of the connector is connected to a ground portion of the electronic device through capacitive coupling, it is possible to block leakage current based on DC current and to suppress electromagnetic interference due to a noise signals or the like. According to an embodiment, a substrate layer on the surface on which the connector is disposed (e.g., the first substrate layer 611 in FIG. 6) and the substrate layer on the surface on which the connector is not disposed (e.g., the second substrate layer 612 in FIG. 6) are provided with respective conductive areas (e.g., the first conductive area 611*a* and the second conductive area 612*b* in FIG. 6) connected to the conductive shell, and the conductive areas may be electrically separated from a ground portion (e.g., the ground portion G in FIG. 6) or ground areas electrically connected to the ground area (e.g., the first ground area 611*a* and the second ground area 612*a* in FIG. 6). In some embodiments, such a conductive area may more easily guide a noise signal or the like to the ground portion by forming capacitive coupling with a shielding layer (e.g., the shielding layer 617 in FIG. 6) connected to the ground portion. For example, even if an antenna structure is disposed adjacent to the connector or the conductive shell, the electronic device may stably perform wireless communication.

For data signal transmission through wired connection, a connector according to USB 3.0 or USB 3.1 standard may be provided to the electronic device in order to implement high-capacity and high-speed communication. As mentioned above, the connector may be electrically separated from a metal portion of the housing in order to prevent electric shock by a user. In some embodiments, data signal transmission conforming to the USB 3.0 or USB 3.1 standard utilizes a signal having a frequency of an about 1.5 to 2.5 GHz band, which may partially overlap a commercial communication network frequency band.

In an embodiment, a wireless frequency signal of an about 700 MHz to 3.5 GHz band may be utilized in a commercial communication network, and when a connector conforming to the USB 3.0 or USB 3.1 standard is disposed adjacent to a radiation conductor (e.g., the metal portion 518*a* or 618 in FIG. 5 or FIG. 6), wireless communication performance may be degraded due to electromagnetic interference. As described above, when a radiation conductor and a connector are provided with a common ground, such electromagnetic interference may be somewhat suppressed, but in order to prevent leakage or electric shock due to the leakage current, the connector (e.g., the conductive shell 615 in FIG. 6) is electrically separated from the radiation conductor or the metal portion of the housing. In an electronic device (e.g., the electronic device 500 or 600 in FIG. 5 or FIG. 6) according to various embodiments of the disclosure, a noise signal may be guided to the ground portion via conductive areas and a shielding layer through capacitive coupling or electromagnetic coupling. For example, an electronic device according to various embodiments of the disclosure may include a stable electromagnetic shielding structure while preventing DC current leaking from a connector or a conductive shell of the connector from flowing to other electrical/electronic components.

Results obtained by measuring the decrease in antenna reception sensitivity in each of a structure in which the connector or the conductive shell of the connector is simply electrically separated from a ground portion or a ground area of the circuit board (e.g., a structure that blocks the flow of DC current and AC current (hereinafter, a "first structure")) and a structure in which the flow of DC current is blocked while AC current (e.g., a noise signal) is guided to a ground portion (hereinafter, a "second structure") are shown in Table 1 below, wherein the results were obtained by measuring the decrease in antenna reception sensitivity of an electronic device equipped with a connector conforming to the USB 3.0 or USB 3.1 standard.

TABLE 1

| | Frequency Band | | | | | | |
|---|---|---|---|---|---|---|---|
| | B28 (700 MHz) | B26 (800 MHz) | B21 (1500 MHz) | B3 (1800 MHz) | B1 (2100 MHz) | B41 (2600 MHz) | B42 (3500 MHz) |
| $1^{st}$ Structure | −1.7 dB | −2.3 dB | −11.5 dB | −17.5 dB | −11.5 dB | −14.2 dB | −11.0 dB |
| | −1.6 dB | −2.4 dB | −10.8 dB | −12.1 dB | −7.8 dB | −10.0 dB | −7.5 dB |
| $2^{nd}$ Structure | −1.6 dB | −2.6 dB | −8.8 dB | −4.8 dB | −4.6 dB | −4.7 dB | −3.2 dB |

The electronic device according to the embodiment of the disclosure is capable of guiding AC current corresponding to a noise signal to a ground portion while blocking leakage of DC current. It can be seen that, when a wireless communication frequency band and a frequency band (about 1.5 to 2.5 GHz) for transmitting a data signal from the connector overlap each other, the antenna reception sensitivity is improved as shown in Table 1. For example, by using a metal material for the exterior of an electronic device, it is possible to protect a user from electric shock by blocking leakage current and to make the appearance of the electronic device luxurious. Further, by utilizing the metal material used in the exterior, it is also possible to ensure a good wireless communication performance.

As described above, an electronic device (e.g., the electronic device 500 or 600 in FIG. 5 or FIG. 6) according to various embodiments of the disclosure may include:

a connector (e.g., the connector 515 in FIG. 5) including a conductive shell (e.g., the conductive shell 615 in FIG. 6) and at least one terminal disposed inside the conductive shell;

a capacitor (e.g., the capacitor 621 in FIG. 6); and a circuit board (e.g., the circuit board 601 in FIG. 6) including a first substrate layer (e.g., the first substrate layer 611 in FIG. 6) facing the connector, a second substrate layer (e.g., the second substrate layer 612 in FIG. 6) disposed under the first substrate layer, and at least one third substrate layer (e.g., the third substrate layer 613 in FIG. 6) disposed between the first substrate layer and the second substrate layer.

The circuit board includes:

a ground area (e.g., the first ground area 611*a* or the second ground area 612*a* in FIG. 6) disposed on at least one of the first substrate layer, the second substrate layer, or the at least one third substrate layer, the ground area being formed of a conductor connected to the ground portion (e.g., the ground portion Gin FIG. 6) of the electronic device and electrically connected to the conductive shell via the capacitor;

a first conductive area (e.g., the first conductive area 611*b* in FIG. 6), which is a partial area of the first substrate layer that faces the connector, the first conductive area being formed of a conductor having a first size to be electrically connected to the conductive shell; and a second conductive area (e.g., the second conductive area 612*b* in FIG. 6), which is an area of the second substrate layer that at least partially faces the first conductive area, with the at least one third substrate layer interposed therebetween, the second conductive area being formed of a conductor having a second size larger than the first size to be electrically connected to the first conductive area.

The first conductive area and the second conductive area may be electrically separated from the ground area, and at least one of the first conductive area and the second conductive area may be disposed adjacent to the ground area.

According to various embodiments, the electronic device may further include a shielding layer (e.g., the shield layer 617 in FIG. 6) disposed to at least partially face the second substrate layer, and the shielding layer may be electrically separated from the second conductive area and may be electrically connected to the ground area.

According to various embodiments, the shielding layer may be formed of a conductor having a third size larger than the second size.

According to various embodiments, the ground area may form a portion of at least one of the first substrate layer or the second substrate layer.

According to various embodiments, the electronic device may further include a housing (e.g., the side member 518 in FIG. 5) at least partially including a metal portion (e.g., the metal portion 518*a*, 518*b*, or 518*c* in FIG. 5 or the metal portion 618 in FIG. 6), the housing being configured to accommodate at least the connector, the capacitor, and the circuit board.

The metal portion of the housing may be electrically connected to the ground area.

According to various embodiments, the electronic device may further include a processor or a communication module (e.g., the processor 120 or the communication module 190 in FIG. 1).

The processor or the communication module may be configured to perform wireless communication using the metal portion of the housing.

According to various embodiments of the disclosure, an electronic device may include:

a connector including a conductive shell and at least one terminal disposed inside the conductive shell;

a capacitor; and a circuit board including a first substrate layer at least partially facing the connector and a second substrate layer disposed under the first substrate layer.

The circuit board may further include:

a ground area disposed on the first substrate layer or the second substrate layer, the ground area being formed of a conductor connected to a ground portion of the electronic device and electrically connected to the conductive shell via the capacitor;

a first conductive area, which is a partial area of the first substrate layer facing the connector, the first conductive area being formed of a conductor to be electrically connected to the conductive shell; and a second conductive area, which is an area of the second substrate layer that faces the first conductive area, the second conductive area being formed of a conductor to be electrically connected to the first conductive area.

At least one of the first conductive area and the second conductive area may be disposed adjacent to the ground area.

According to various embodiments, the circuit board may further include multiple third substrate layers disposed between the first substrate layer and the second substrate layer.

According to various embodiments, the second area may be formed to be wider than the first conductive area.

According to various embodiments, the first conductive area or the second conductive area may be electrically separated from the ground area.

According to various embodiments, the electronic device may further include a shielding layer to at least partially face the second substrate layer, and the shielding layer may be electrically separated from the second conductive area and may be electrically connected to the ground area.

According to various embodiments, the shielding layer may be formed to be wider than the second conductive area.

According to various embodiments, the electronic device may further include a housing at least partially including a metal portion, the housing being configured to accommodate at least the connector, the capacitor, and the circuit board.

The metal portion of the housing may be electrically connected to the ground area.

According to various embodiments, the electronic device may further include a processor or a communication module.

The processor or the communication module may be configured to perform wireless communication using the metal portion of the housing.

According to various embodiments of the disclosure, an electronic device may include:

a connector including a conductive shell and at least one terminal disposed inside the conductive shell;

a circuit board including a first substrate layer at least partially facing the connector and a second substrate layer disposed under the first substrate layer;

a housing at least partially including a metal portion, the housing being configured to accommodate at least the connector and the circuit board; and a processor or a communication module configured to perform wireless communication using the metal portion of the housing.

The circuit board may further include:
a ground area disposed on at least one of the first substrate layer or the second substrate layer, the ground area being formed of a conductor connected to a ground portion of the electronic device and forming capacitive coupling with the conductive shell;
a first conductive area, which is a partial area of the first substrate layer facing the connector, the first conductive area being formed of a conductor having a first size to be electrically connected to the conductive shell; and
a second conductive area, which is an area of the second substrate layer that at least partially faces the first conductive area, the second conductive area being formed of a conductor having a second size larger than the first size to be electrically connected to the first conductive area or to form capacitive coupling with the first conductive area.

The first conductive area and the second conductive area may be electrically separated from the ground area, and at least one of the first conductive area and the second conductive area may be disposed adjacent to the ground area.

According to various embodiments, the electronic device may further include a shielding layer disposed to at least partially face the second substrate layer, and
the shielding layer may be electrically separated from the second conductive area and may be electrically connected to the ground area.

According to various embodiments, the shielding layer may be formed of a conductor having a third size larger than the second size.

According to various embodiments, the ground area may form a portion of the first substrate layer together with the first conductive area, or may form a portion of the second substrate layer together with the second conductive area.

According to various embodiments, the circuit board may further include multiple third substrate layers provided between the first substrate layer and the second substrate layer.

The second substrate layer may form capacitive coupling with the first substrate layer, with the multiple third substrate layers interposed therebetween.

According to various embodiments, the ground area may include a portion of at least one of the multiple third substrate layers.

In the foregoing detailed description, specific embodiments of the disclosure have been described. However, it will be evident to a person ordinarily skilled in the art that various modifications may be made without departing from the scope of the disclosure.

The invention claimed is:

1. An electronic device comprising:
a connector comprising a conductive shell and at least one terminal disposed inside the conductive shell;
a capacitor; and
a circuit board comprising a first substrate layer facing the connector, a second substrate layer disposed under the first substrate layer, and at least one third substrate layer disposed between the first substrate layer and the second substrate layer,
wherein the circuit board comprises:
a ground area disposed on at least one of the first substrate layer, the second substrate layer, or the at least one third substrate layer, the ground area being formed of a conductor connected to a ground portion of the electronic device and electrically connected to the conductive shell via the capacitor;
a first conductive area, which is a partial area of the first substrate layer facing the connector, the first conductive area being formed of a conductor having a first size to be electrically connected to the conductive shell; and
a second conductive area, which is an area of the second substrate layer that at least partially faces the first conductive area, with the at least one third substrate layer interposed therebetween, the second conductive area being formed of a conductor having a second size larger than the first size to be electrically connected to the first conductive area, and
wherein the first conductive area and the second conductive area are electrically separated from the ground area, and at least one of the first conductive area and the second conductive area is disposed adjacent to the ground area.

2. The electronic device of claim 1, further comprising:
a shielding layer disposed to at least partially face the second substrate layer,
wherein the shielding layer is electrically separated from the second conductive area and is electrically connected to the ground area.

3. The electronic device of claim 2, wherein the shielding layer is formed of a conductor having a third size larger than the second size.

4. The electronic device of claim 1, wherein the ground area forms a portion of at least one of the first substrate layer or the second substrate layer.

5. The electronic device of claim 1, further comprising:
a housing at least partially comprising a metal portion, the housing being configured to accommodate at least the connector, the capacitor, and the circuit board,
wherein the metal portion of the housing is electrically connected to the ground area.

6. The electronic device of claim 5, further comprising:
a processor or a communication module,
wherein the processor or the communication module is configured to perform wireless communication using the metal portion of the housing.

7. An electronic device comprising:
a connector comprising a conductive shell and at least one terminal disposed inside the conductive shell;
a capacitor; and
a circuit board comprising a first substrate layer at least partially facing the connector and a second substrate layer disposed under the first substrate layer,
wherein the circuit board comprises:
a ground area disposed on the first substrate layer or the second substrate layer, the ground area being formed of a conductor connected to a ground portion of the electronic device and electrically connected to the conductive shell via the capacitor;
a first conductive area, which is a partial area of the first substrate layer facing the connector, the first conductive area being formed of a conductor to be electrically connected to the conductive shell; and
a second conductive area, which is an area of the second substrate layer that faces the first conductive area, the second conductive area being formed of a conductor to be electrically connected to the first conductive area, and
wherein at least one of the first conductive area and the second conductive area is disposed adjacent to the ground area.

8. The electronic device of claim 7, wherein the circuit board further comprises multiple third substrate layers provided between the first substrate layer and the second substrate layer.

9. The electronic device of claim 7, wherein the second area is formed to be wider than the first conductive area.

10. The electronic device of claim 7, wherein the first conductive area or the second conductive area is electrically separated from the ground area.

11. The electronic device of claim 7, further comprising:
a shielding layer disposed to at least partially face the second substrate layer,
wherein the shielding layer is electrically separated from the second conductive area and is electrically connected to the ground area.

12. The electronic device of claim 11, wherein the shielding layer is formed to be wider than the second conductive area.

13. The electronic device of claim 7, further comprising:
a housing at least partially comprising a metal portion, the housing being configured to accommodate at least the connector, the capacitor, and the circuit board,
wherein the metal portion of the housing is electrically connected to the ground area.

14. The electronic device of claim 13, further comprising:
a processor or a communication module,
wherein the processor or the communication module is configured to perform wireless communication using the metal portion of the housing.

15. An electronic device comprising:
a connector comprising a conductive shell and at least one terminal disposed inside the conductive shell;
a circuit board comprising a first substrate layer at least partially facing the connector and a second substrate layer disposed under the first substrate layer;
a housing at least partially comprising a metal portion, the housing being configured to accommodate at least the connector and the circuit board; and
a processor or a communication module configured to perform wireless communication using the metal portion of the housing,
wherein the circuit board comprises:
a ground area disposed on at least one of the first substrate layer or the second substrate layer, the ground area being formed of a conductor connected to a ground portion of the electronic device and forming capacitive coupling with the conductive shell;
a first conductive area, which is a partial area of the first substrate layer facing the connector, the first conductive area being formed of a conductor having a first size to be electrically connected to the conductive shell; and
a second conductive area, which is an area of the second substrate layer that at least partially faces the first conductive area, the second conductive area being formed of a conductor having a second size larger than the first size to be electrically connected to the first conductive area or to form capacitive coupling with the first conductive area, and
wherein the first conductive area and the second conductive area are electrically separated from the ground area, and at least one of the first conductive area and the second conductive area is disposed adjacent to the ground area.

16. The electronic device of claim 15, further comprising:
a shielding layer disposed to at least partially face the second substrate layer,
wherein the shielding layer is electrically separated from the second conductive area and is electrically connected to the ground area.

17. The electronic device of claim 16, wherein the shielding layer is formed of a conductor having a third size larger than the second size.

18. The electronic device of claim 15, wherein the ground area forms a portion of the first substrate layer together with the first conductive area, or forms a portion of the second substrate layer together with the second conductive area.

19. The electronic device of claim 15, wherein the circuit board further comprises multiple third substrate layers provided between the first substrate layer and the second substrate layer, and
wherein the second substrate layer forms capacitive coupling with the first substrate layer, with the multiple third substrate layers interposed therebetween.

20. The electronic device of claim 19, wherein the ground area comprises a portion of at least one of the multiple third substrate layers.

* * * * *